United States Patent
Pokharna

(10) Patent No.: US 12,004,324 B2
(45) Date of Patent: Jun. 4, 2024

(54) METALLIC THERMAL INTERFACE MATERIALS AND ASSOCIATED DEVICES, SYSTEMS, AND METHODS

(71) Applicant: DEEIA INC., Saratoga, CA (US)

(72) Inventor: Himanshu Pokharna, Saratoga, CA (US)

(73) Assignee: Deeia Inc., Saratoga, CA (US)

( * ) Notice: Subject to any disclaimer, the term of this patent is extended or adjusted under 35 U.S.C. 154(b) by 0 days.

(21) Appl. No.: 17/879,630

(22) Filed: Aug. 2, 2022

(65) Prior Publication Data
US 2023/0413480 A1    Dec. 21, 2023

Related U.S. Application Data

(60) Provisional application No. 63/354,175, filed on Jun. 21, 2022.

(51) Int. Cl.
*H01M 10/659* (2014.01)
*H01L 23/427* (2006.01)
(Continued)

(52) U.S. Cl.
CPC ....... *H05K 7/2029* (2013.01); *H05K 7/20409* (2013.01); *H05K 7/20509* (2013.01);
(Continued)

(58) Field of Classification Search
CPC ............. H05K 7/2029; H05K 7/20409; H05K 7/20509; G06F 1/20; H01L 23/427;
(Continued)

(56) References Cited

U.S. PATENT DOCUMENTS

| 5,070,788 A | 12/1991 | Carisella et al. |
| 5,170,930 A | 12/1992 | Dolbear et al. |

(Continued)

FOREIGN PATENT DOCUMENTS

| TW | 200400229 | 1/2004 |
| TW | 201017837 | 5/2010 |

OTHER PUBLICATIONS

Office Action for TW 111133089 mailed Aug. 28, 2023.
(Continued)

*Primary Examiner* — Michael C Zarroli
(74) *Attorney, Agent, or Firm* — WORKMAN NYDEGGER

(57) ABSTRACT

A heat-transfer component defines a thermal-interface surface and has a metallic thermal-interface material bonded to the thermal-interface surface. The metallic thermal-interface material has a solid-to-liquid phase-change temperature between about 60° C. and about 90° C. With a thermal-interface material bonded to the thermal-interface surface, the thermal-contact resistance between the thermal-interface material and the heat-transfer component can be reduced or substantially eliminated compared to conventional thermal-interface materials, including conventional metallic thermal-interface materials. Also disclosed are electrical devices having a heat generating component cooled by such a heat-transfer component.

32 Claims, 8 Drawing Sheets

(51) Int. Cl.
*H05K 7/20* (2006.01)
*G06F 1/20* (2006.01)
*H01M 10/613* (2014.01)
*H01M 10/653* (2014.01)
*H01M 10/6551* (2014.01)

(52) U.S. Cl.
CPC .............. *G06F 1/20* (2013.01); *H01L 23/427* (2013.01); *H01L 2924/00* (2013.01); *H01M 10/613* (2015.04); *H01M 10/653* (2015.04); *H01M 10/6551* (2015.04); *H01M 10/659* (2015.04)

(58) Field of Classification Search
CPC ............. H01M 10/613; H01M 10/653; H01M 10/6551; H01M 10/659
See application file for complete search history.

(56) References Cited

U.S. PATENT DOCUMENTS

| | | | |
|---|---|---|---|
| 7,347,354 B2 * | 3/2008 | Hurley | B23K 31/02 228/221 |
| 2003/0152764 A1 * | 8/2003 | Bunyan | H01L 23/4275 428/328 |
| 2003/0224186 A1 | 12/2003 | Feng et al. | |
| 2004/0017656 A1 * | 1/2004 | Lee | H01L 23/42 174/15.2 |
| 2005/0049357 A1 | 3/2005 | Zhong et al. | |
| 2005/0228097 A1 | 10/2005 | Zhong | |
| 2006/0043579 A1 | 3/2006 | He et al. | |
| 2008/0201603 A1 | 8/2008 | Ritz et al. | |
| 2008/0237841 A1 | 10/2008 | Arana et al. | |
| 2009/0016953 A1 | 1/2009 | Weil et al. | |
| 2010/0319900 A1 | 12/2010 | Abyzov | |
| 2011/0022821 A1 | 1/2011 | Fei et al. | |
| 2013/0091693 A1 | 4/2013 | Campbell et al. | |
| 2013/0193194 A1 | 8/2013 | Yang et al. | |
| 2014/0048924 A1 | 2/2014 | Lee | |
| 2014/0102776 A1 | 4/2014 | Lower et al. | |
| 2016/0223269 A1 * | 8/2016 | Hartmann | C09K 5/063 |
| 2019/0132994 A1 | 5/2019 | Johnson et al. | |
| 2019/0393573 A1 | 12/2019 | Harmann et al. | |
| 2020/0103177 A1 | 4/2020 | Chang | |
| 2020/0373220 A1 | 11/2020 | Chan Arguedas et al. | |
| 2021/0110980 A1 | 4/2021 | Qili et al. | |
| 2022/0158273 A1 * | 5/2022 | Khateeb Razack | H01M 10/617 |

OTHER PUBLICATIONS

International Search Report and Written Opinion for PCT/US2022/039196 mailed Nov. 7, 2022.

PCT International Search Report and Written Opinion for PCT/US23/25894, mailed Oct. 2, 2023.

* cited by examiner

METALLIC THERMAL INTERFACE MATERIALS AND ASSOCIATED DEVICES, SYSTEMS, AND METHODS

FIELD

This application and the subject matter disclosed herein (collectively referred to as the "disclosure"), generally concern metallic thermal-interface materials, some of which partially or wholly undergo phase transition within an expected range of operating temperatures. More particularly, but not exclusively, this disclosure pertains to devices and systems for transferring heat, e.g., for cooling heat-generating, electrical components, that incorporate such metallic thermal-interface materials.

BACKGROUND INFORMATION

Many industrial processes, consumer goods, power generators, combustion chambers, communication devices, electronic components, electrical storage components (e.g., batteries), etc., and associated systems, rely on heat transfer to function as intended. For example, some rely on cooling (e.g., radio transmitters) and others rely on heating (e.g., endo-thermic chemical reactions) to maintain a temperature within a specified range between an upper threshold temperature and a lower threshold temperature.

The prior art has responded to these challenges with a number of techniques for transferring heat from one medium to another. For example, conventional air cooling uses a fan or other air-mover to draw heat away from or to convey heat to another medium. Air cooling can be supplemented with an air-cooled heat sink, e.g., often a plate of thermally conductive material having surfaces, or fins, extending from the plate to provide a larger surface area available for transferring heat to or from the air flowing over the extended surfaces. Some heat-transfer systems use a liquid to transfer heat, as many liquids provide a relatively higher rate of heat transfer compared to gasses, e.g., air. In still other systems, a heat-transfer fluid changes phase from liquid to gas (or vice-versa) to absorb (or to dissipate, respectively) relatively large amounts of energy over a narrow range of temperatures.

Some prior approaches for transferring heat use a heat-transfer component (e.g., a "heat exchanger," "heat sink," "cold plate," "evaporator," or "condenser") to transfer heat to a fluid (e.g., a liquid, a gas, or a mixture thereof) from a solid device, or vice-versa. For example, a typical heat-transfer component defines an intended heat-transfer surface to be placed in thermal contact with a corresponding surface of the other solid device. Such placement provides a conductive heat-transfer path between the heat-transfer component and the other solid device. The heat-transfer component facilitates convective heat transfer between the fluid passing through or over the solid features of the heat-transfer component and those solid features. Accordingly, when the heat-transfer component is placed in thermal contact with the solid device, a combination of convective and conductive heat-transfer mechanisms facilitate heat transfer between the solid device and the fluid passing through or over the heat-transfer component.

For example, a cold plate or a heat sink for cooling a heat-generating device (e.g., a processing unit of a computer system) is typically placed into thermal contact with a corresponding surface of the heat-generating device or its packaging. As the heat-generating device operates, excess heat conducts across the interface between the heat-generating device and the cold plate or heat sink. A cooling medium (e.g., air, a mixture of water and glycol, or a two-phase refrigerant) passes through or over features of the cold plate or heat sink, absorbing the excess heat through convective heat-transfer and carrying it away from the cold plate or heat sink to be rejected elsewhere.

A solid-solid interface, even between machined, flat surfaces, can introduce a substantial thermal resistance to the heat-transfer system. As used herein, the term "thermal resistance" means the ratio of temperature difference between two regions to the heat-flux between the two regions. As used herein, "heat-flux" means the rate of heat-transfer per unit area. Thus, "thermal resistance" is the ratio of temperature difference to rate of heat transfer per unit area between two regions, which yields units of ° C.-cm$^2$/W. Accordingly, an interface with higher thermal resistance results in a relatively larger temperature gradient across the interface for a given heat flux as compared to an interface with lower thermal resistance exposed to the same heat flux. Conversely, a relatively higher thermal resistance results in a relatively lower rate of heat-transfer limit through a given region for a given allowable change in temperature compared to a lower thermal resistance.

Greases, pastes and solders have been used to reduce the so-called thermal-contact resistance (sometimes also referred to in the art as a "contact resistance," "thermal-interface resistance," or "interface resistance") at solid-solid interfaces, improving the capacity to transfer heat across a given interface for a given temperature gradient across the interface. Conventional thermal pastes and greases have required substantial compressive pressure across the solid-solid interface. For example, conventional pressures across the solid-solid interface have needed to exceed 20 pounds-per-square-inch ("PSI") and even up to 50 PSI to achieve conventional thermal-resistance performance. Nevertheless, thermal-contact resistance has remained and still remains a substantial component of the overall thermal budget in many applications facing high power and limited upper-threshold temperature targets.

SUMMARY

Disclosed metallic thermal-interface materials can provide a low thermal-contact resistance across a variety of solid-solid interfaces. For example, some disclosed materials can provide a thermal resistance of less than about 0.05° C.-cm$^2$/W, such as, for example, between about 0.01° C.-cm$^2$/W and about 0.06° C.-cm$^2$/W, with between about 0.02° C.-cm$^2$/W and about 0.04° C.-cm$^2$/W. In some embodiments, disclosed materials provide a thermal-contact resistance of about 0.03° C.-cm$^2$/W. Moreover, these levels of performance can be achieved with less than 20 PSI applied across the solid-solid interface, such as, for example, between about 8 PSI and about 18 PSI, with between about 10 PSI and about 12 PSI. With some embodiments of disclosed thermal-interface materials, a suitable pressure across a solid-solid interface can be about 10 PSI such as, for example, between about 9 PSI and about 12 PSI, or simply greater than about 10 PSI, such as, for example, between about 10 PSI and about 15 PSI.

In some embodiments, a heat-transfer component defines an outer surface configured to mate with a corresponding surface of another device (which can be exothermic or endothermic during its operation). For example, the outer surface of the heat-transfer component can be substantially planar ("flat"), i.e., the outer surface can have a measure of flatness less than about 70 μm/cm, such as, for example, between about 10 µm/cm and about 75 µm/cm, with between about 20 µm/cm and about 50 µm/cm being but one exemplary range of flatness. The corresponding surface of the other device can similarly be flat. In other embodiments, an outer surface of the heat-transfer component can be machined or otherwise formed to have a complementary contour relative to an opposed surface of the other device (e.g., a heat-generating component). For example, if a heat-generating component has a convex (or other, e.g., arbitrary, non-flat surface), the outer surface of the heat-transfer component can have a complementary concave (or other negative, non-flat contour) that mates closely with the surface of the heat-generating component.

When mated together, the flat surface of the heat-transfer component can be positioned opposite the corresponding surface of the other device, and a disclosed interface material can be positioned between the opposed surfaces. As described more fully below, this arrangement can provide a thermal-contact resistance between the mated surfaces of less than about 0.05 C-cm$^2$/W, such as, for example, between about 0.01° C.-cm$^2$/W and about 0.06° C.-cm$^2$/W, with between about 0.02° C.-cm$^2$/W and about 0.04° C.-cm$^2$/W. In some embodiments, the thermal-contact resistance of this arrangement is about 0.03° C.-cm$^2$/W.

Nevertheless, as explained more fully below, disclosed thermal-interface materials can be more forgiving during manufacturing and assembly than prior, conventional thermal-interface materials. For example, disclosed thermal-interface materials can provide lower thermal-resistance across a non-uniform solid-solid interface (e.g., arising from one solid surface being tilted relative to the opposed solid surface, or from a non-uniform surface flatness) than a conventional paste, grease or foil provides, even with a relatively more uniform solid-solid interface.

Some aspects of this disclosure pertain to heat-transfer components that include a thermal-interface surface and a metallic thermal-interface material bonded to the thermal-interface surface. The metallic thermal-interface material has a solidus-to-liquidus transition temperature between about 60° C. and about 90° C.

In an embodiment, the metallic thermal-interface material is a eutectic mixture of Bismuth, Indium, Tin and Gallium. The solidus-to-liquidus transition temperature of the metallic thermal-interface material can be about 60° C., about 70° C., about 80° C., or about 90° C.

The metallic thermal-interface material can be a non-eutectic mixture of Bismuth, Indium, Tin and Gallium. In some embodiments of such non-eutectic mixtures, the solidus-to-liquidus transition temperature is about 90° C. In some embodiments where the solidus-to-liquidus transition temperature is about 90° C., the metallic thermal-interface material has a liquidus-to-solidus transition temperature of about 70° C. In some embodiments of such non-eutectic mixtures, the solidus-to-liquidus transition temperature is less than about 90° C. and the liquidus-to-solidus transition temperature is above about 70° C.

In some embodiments, the heat-transfer component is an integrated heat spreader configured to overlie an integrated-circuit die. The thermal-interface surface can be a first major surface of the integrated heat spreader. The integrated heat spreader can define a second major surface positioned opposite the thermal-interface surface. The second major surface can be configured to face the integrated-circuit die and the first major surface can be configured to face a heat-removal device.

In other embodiments, the heat-transfer component is a heat-removal device configured to dissipate heat received from a heat-generating electronic component. The heat-removal device can have a base and the thermal-interface surface can be a first major surface of the base. The base can further define a second major surface opposite the first major surface. The heat-removal device can also have a plurality of fins extending from the second major surface.

Some aspects of this disclosure pertain to electrical devices that include a heat-generating component, a heat-transfer component and a metallic thermal-interface material. The heat-generating component defines a first thermal-interface surface, and the heat-transfer component defines a second thermal-interface surface. The metallic thermal-interface material is bonded to the second thermal-interface surface. The metallic thermal-interface material has a solidus-to-liquidus transition temperature between about 60° C. and about 90° C.

In some embodiments, the metallic thermal-interface material is a eutectic mixture of Bismuth, Indium, Tin and Gallium. With some embodiments of such eutectic mixtures, the solidus-to-liquidus transition temperature can be about 60° C., about 70° C., about 80° C., or about 90° C.

In other embodiments, the metallic thermal-interface material is a non-eutectic mixture of Bismuth, Indium, Tin and Gallium. The solidus-to-liquidus transition temperature can be about 90° C. With some embodiments of such non-eutectic mixtures, the metallic thermal-interface material has a liquidus-to-solidus transition temperature of about 70° C. With some embodiments of such non-eutectic mixtures, the solidus-to-liquidus transition temperature can be less than about 90° C. and the liquidus-to-solidus transition temperature can be above about 70° C.

The heat-transfer component can be an integrated heat spreader configured to overlie an integrated-circuit die. The thermal-interface surface can be a first major surface of the integrated heat spreader. The integrated heat spreader can define a second major surface positioned opposite the thermal-interface surface. The second major surface can be configured to face the integrated-circuit die and the first major surface can be configured to face a heat-removal device.

The heat-transfer component can be a heat-removal device configured to dissipate heat received from the heat-generating electronic component. The heat-removal device can have a base and the thermal-interface surface can be a first major surface of the base. The base can also define a second major surface opposite the first major surface. The heat-removal device can also have a plurality of fins extending from the second major surface.

In some embodiments, the heat-generating component is an electronic processing unit. In other embodiments, the heat-generating component is an electrical storage battery.

The foregoing and other features and advantages will become more apparent from the following detailed description, which proceeds with reference to the accompanying drawings.

BRIEF DESCRIPTION OF THE DRAWINGS

Referring to the drawings, wherein like numerals refer to like parts throughout the several views and this specification, aspects of presently disclosed principles are illustrated by way of example, and not by way of limitation.

DETAILED DESCRIPTION

The following describes various principles related to metallic thermal-interface materials. More particularly, but not exclusively, some embodiments include devices and systems for transferring heat (e.g., for cooling heat-generating, electrical components) that incorporate such metallic thermal-interface materials. Some disclosed thermal-interface materials partially or wholly undergo phase transition within an expected range of operating temperatures. Nevertheless, components and systems having attributes that are different from those specific examples discussed herein can embody one or more presently disclosed principles, and can be used in applications not described herein in detail. Accordingly, such alternative embodiments also fall within the scope of this disclosure.

I. Overview

Concepts disclosed herein generally concern metallic thermal-interface materials, and in some respects, their application to heat-transfer components and use in heat-transfer systems. For example, some disclosed concepts pertain to systems, methods, and components to facilitate cooling of heat-dissipating components, in part by applying a metallic thermal-interface material to a surface of a heat-transfer component. In other respects, material composition and physical properties of disclosed metallic thermal-interface materials are described. And in still other respects, methods of manufacturing components that incorporate disclosed metallic thermal interface materials are described.

Figure 1:
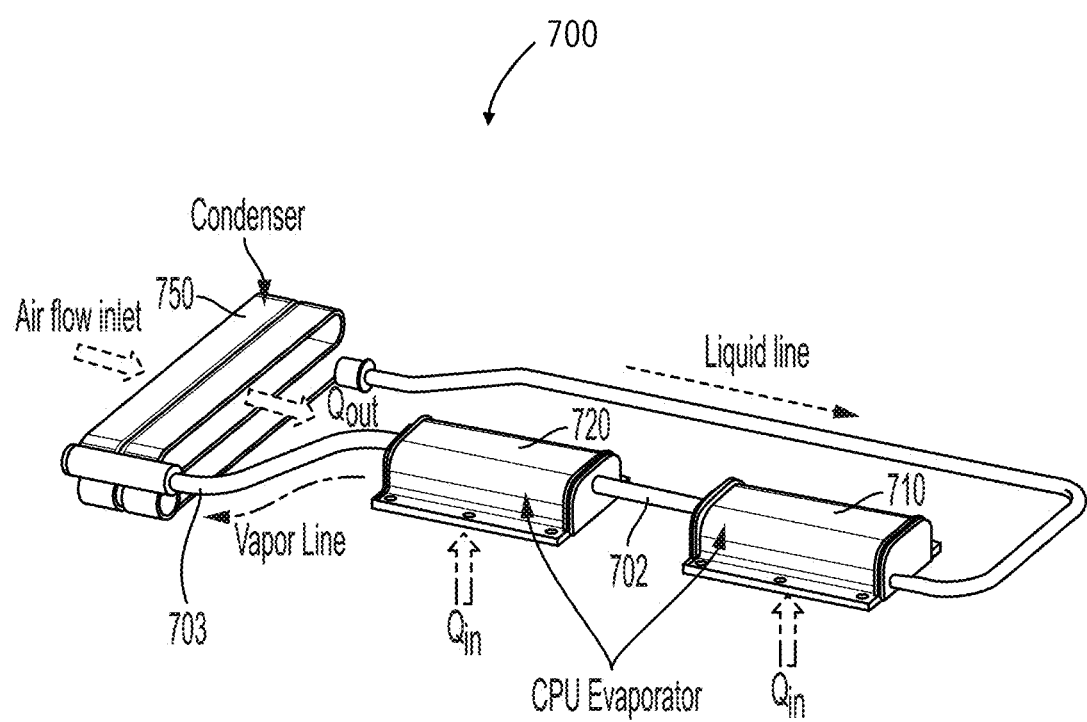
FIG. 1 shows an embodiment of a two-phase heat-transfer system that incorporates a thermal-interface material.

Referring now to FIG. 1, a two-phase cooling system is shown by way of example (although disclosed thermal-interface materials can be used in combination with single-phase cooling systems, e.g., air-cooled or liquid-cooled systems). Referring again to FIG. 1, a loop thermosyphon 700 is shown having a plurality of evaporators fluidly coupled with each other in series (i.e., working fluid that passes through one of the evaporators also passes through the other evaporator(s) serially, one-at-a-time). Each evaporator is thermally coupled with a heat-generating component having an upper-threshold temperature specification. A surface (not shown) of each evaporator is positioned opposite (and placed in thermal contact with) a corresponding surface (not shown) of a processing unit (not shown but generating heat $Q_{in}$). A metallic thermal-interface material is disposed in the interstitial region between the opposed surfaces of the evaporator and processing unit to facilitate conductive heat-transfer.

A working fluid enters the first evaporator 710, absorbing the heat $Q_{in}$ from the processing unit and exhausting a saturated mixture of vapor and liquid to the first vapor line 702, which then enters the second evaporator 720 and absorbs further heat $Q_{in}$ from another processing unit. The vapor exhausts from the second evaporator 720 to the second vapor line 703 and flows into the condenser 750, where the working fluid rejects latent heat and condenses to the liquid phase, which flows through the liquid conduit back to the first evaporator 710.

Figure 2:
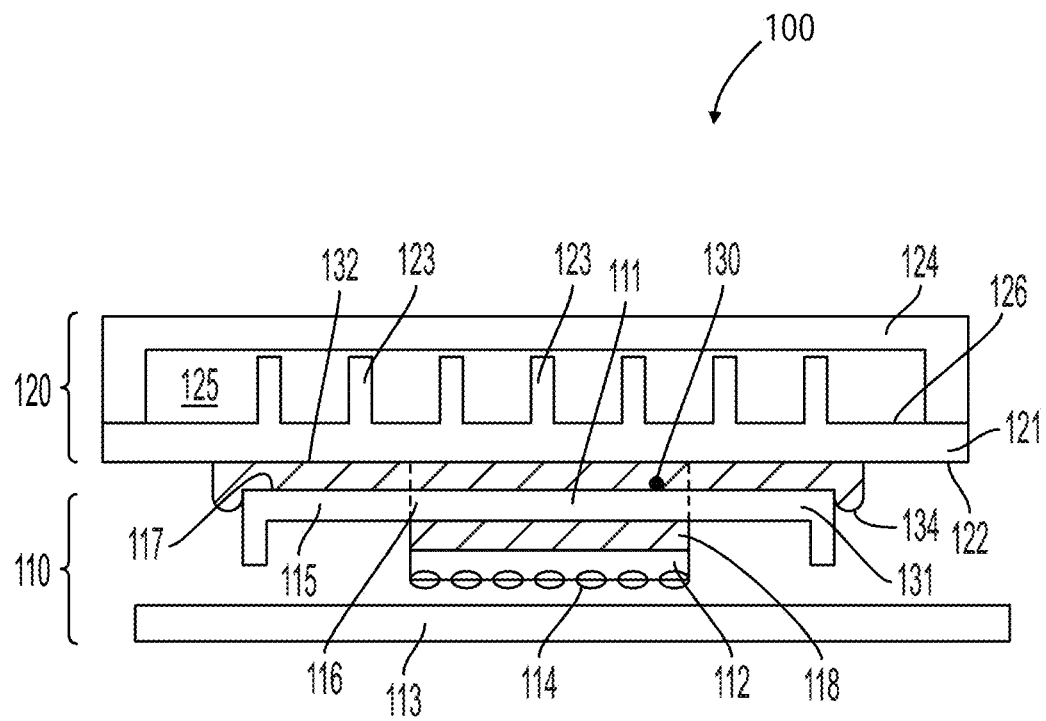
FIG. 2 schematically illustrates a cross-sectional view of a heat-transfer component embodied as an evaporator thermally coupled with a heat-generating device embodied as a processing unit (e.g., a graphics processing unit, a central processing unit). The interface, filled with thermal-interface material, between the heat-transfer component and the heat-generating device is enlarged for illustrative purposes.

FIG. 2 schematically illustrates a cross-sectional view of another heat transfer assembly 100. The assembly 100 includes a heat-generating device 110 cooled by a heat-transfer component 120. Similar to the metallic thermal-interface material described above in relation to FIG. 1, a metallic thermal-interface material 130 is disposed in the interstitial region between the opposed surfaces 122, 111, respectively, of the evaporator and processing unit to facilitate conductive heat-transfer from the heat-generating device 110 to the heat-transfer component 120.

As noted above, a heat-transfer component 120 can assume any of a variety for configurations. Although not so limited, FIG. 2 schematically illustrates the heat-transfer component 120 as an evaporator. As with the evaporators 710, 720 shown in FIG. 1, the heat-transfer component 120 includes a conductive base 121 having fins 123 extending upwardly from an upper surface 126 thereof. The fins 123 define flow channels (e.g., minichannels or microchannels) therebetween. A housing 124 overlies the fins 123 and fluidically seals with the base 121, defining an interior volume 125 through which a working fluid (e.g., a refrigerant that changes phase in this embodiment, but in other embodiments a single-phase liquid) flows as it absorbs heat (e.g., $Q_{in}$, FIG. 1) from the fins, which heat originated from the heat-generating component 110.

Like the heat-transfer component 120, the heat-generating component 110 can assume any of a variety of configurations. Although not so limited, FIG. 2 depicts the heat-generating component 110 as a processing unit having a single functional die 112 mounted in a so-called "flip-chip" arrangement to a functional substrate 113. Solder bumps 114 provide physical and electrical connectivity between circuitry defined by the die 112 and electrical circuitry defined by the substrate 113. (The substrate's 113 further circuitry and solder connections are omitted from FIG. 2 for clarity.) The heat-generating component 110 also includes an integrated heat spreader ("IHS") 115 thermally coupled with the die 112 by way of a primary thermal-interface 118 spanning the interstitial region between the IHS 115 and the die 112. The primary thermal-interface 118 may embody disclosed principles or may be filled with a different material.

Figure 14:
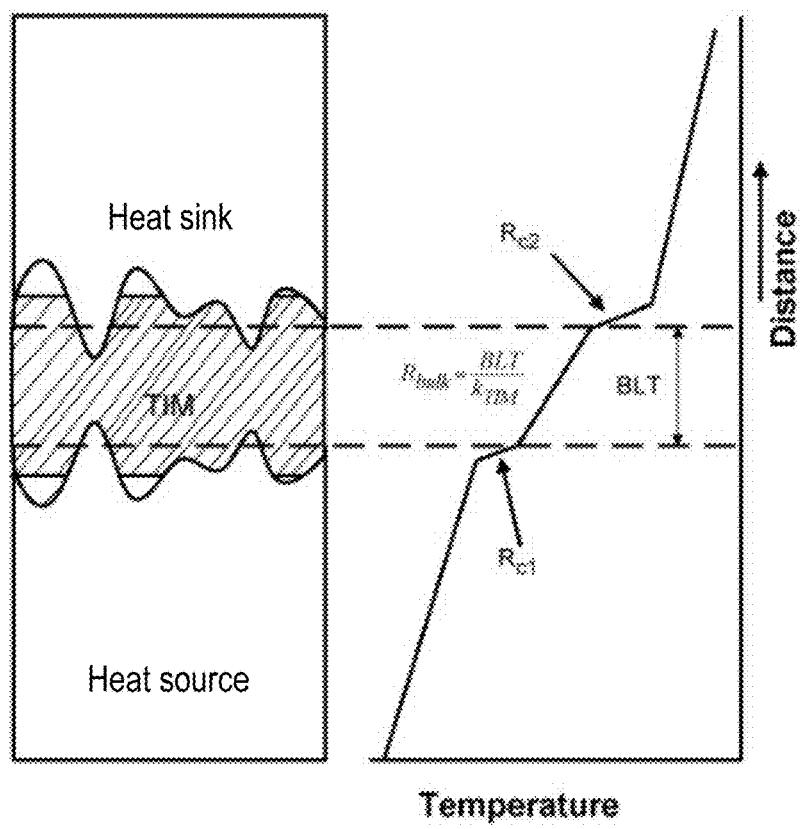
FIG. 14 shows a schematic illustration of a solid-solid interface thermally enhanced with a thermal interface material, together with a plot of temperature vs. position across the solid-solid interface.

Referring still to FIG. 2, the metallic thermal-interface material 130 disposed in the interstitial region between the opposed surfaces 122, 111 defines an IHS-contact region 131 in direct physical contact with the outer surface 111 of the IHS 115. Similarly, the thermal-interface material 130 defines a heat-transfer-component-contact region 132 in direct physical contact with the lower surface 122 of the base 121. Consequently, the thermal-contact resistance at a solid-solid interface between the lower surface 122 of the base 121 and the IHS surface 117, improved with a thermal-interface material 130, can be described as a sum of three discrete, constituent thermal resistances: (1) a thermal-contact resistance between the lower surface 122 and the upper surface of the thermal-interface material 132 (Rc2 in FIG. 14); (2) a thermal resistance across the thermal-interface material from the upper surface 132 of the thermal-interface material to the surface 131, corresponding to the bulk thermal conductivity of the thermal interface material 130 (Rbulk in FIG. 14); and (3) a thermal-contact resistance between the lower surface 131 of the thermal-interface material and the IHS surface 117 (Rc1 in FIG. 14).

Figure 15:
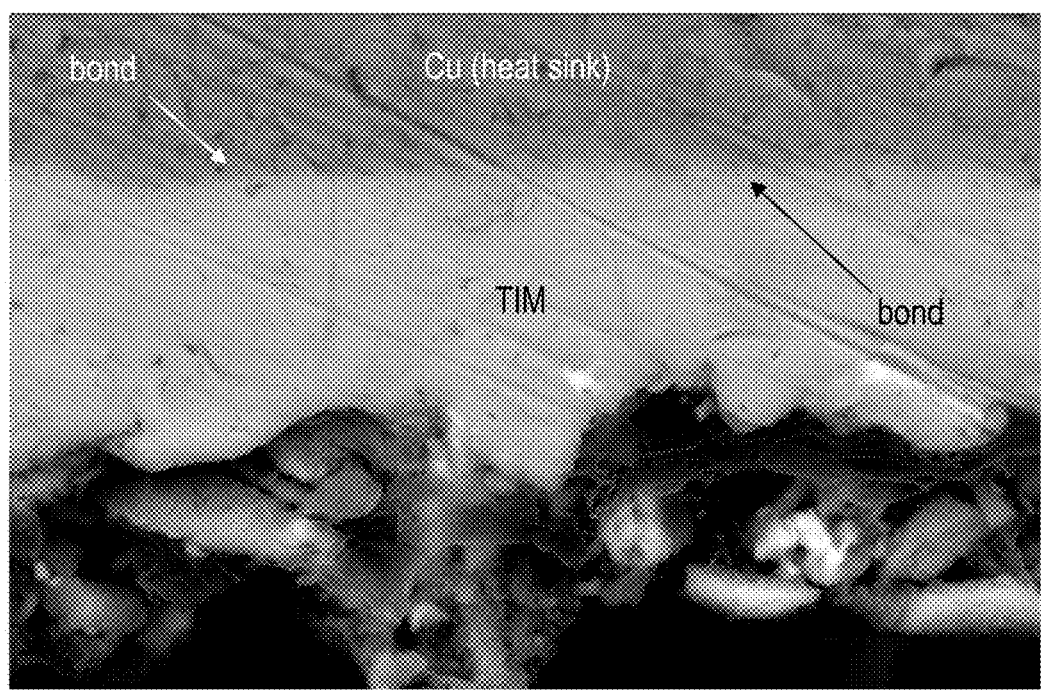
FIG. 15 shows an image taken with a scanning electron microscope showing a disclosed thermal-interface material bonded with copper (e.g., a heat sink or a cold plate).

As described more fully below, some embodiments solder-bond the heat-transfer-component-contact region 132 of the thermal-interface material 130 to the surface 122 of the heat-transfer component 120 before assembling the heat-transfer component into thermal contact with the IHS 115, reducing or eliminating the first level of thermal-contact resistance (i.e., between the lower surface 122 and the upper surface of the thermal-interface material 132 (Rc2 in FIG. 14)) compared to prior greases, pastes and even metallic foils (including those that change phase during operation). For example, the solder-bond of disclosed embodiments provides significantly better wetting of the lower surface 122 as compared to prior thermal-interface materials, as shown for example in FIG. 15. As also described more fully below, the thermal-interface material 130 can define one or more dams 134 positioned outwardly of the IHS-contact region 131, maintaining a molten form of the thermal-interface material 130 within the confines of interface between the IHS and the heat-transfer component.

During operation of the heat-generating device 110 and the heat-transfer component 120, a temperature of the thermal-interface material 130 can approach or even exceed a melting-point temperature of the material (eutectic mixtures) or one or more constituents (non-eutectic mixtures) of the material. For example, a region 137 (FIG. 3) of the TIM 130, e.g., a volume of material overlying the 118 and positioned between the dashed lines 116, can melt during normal operation of the heat-generating device 110 and the heat-transfer component 120 while leaving a remaining portion of the TIM 130 (e.g., positioned outward of the dashed lines 116) in a solid phase. The melted, liquidus TIM can effectively wet corresponding regions of the IHS surface 117 and base surface 122, improving thermal contact and reducing thermal resistance between the TIM 130 and each of the components 110, 120. As explained more fully below, some embodiments bond the TIM 130 to the base surface 122, further reducing thermal resistance between the TIM 130 and the component 120. Further, because the metallic TIM 130 can have a bulk thermal conductivity in excess of 50 W/m-K, e.g., between about 50 W/m-K and about 200 W/m-K, such as, for example, between about 60 W/m-K and about 100 W/m-K, or about 70 W/m-K in a specific embodiment, the overall thermal resistance of a disclosed thermal interface using a metallic TIM 130 can be substantially lower than a similar thermal interface using a conventional paste or grease.

II. Thermal Interfaces

Figure 3:
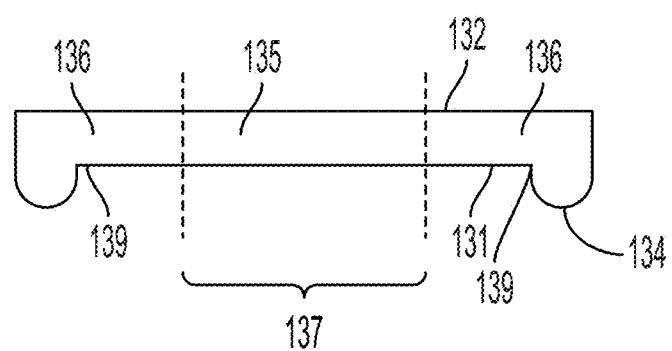
FIG. 3 schematically illustrates an enlarged cross-sectional view of the thermal-interface material in FIG. 2.

Referring now to FIG. 3, an enlarged thermal interface 130 is shown isolated from the corresponding heat-transfer component 120 and heat-generating component 110. The interface 130 has a region 137 corresponding to (e.g., overlying or adjacent to) a given heat source (e.g., the die 112 in FIG. 2). During operation of the heat-generating component 110 and the heat-transfer component 120, some or all of the volume of TIM melts within the region 137. For example, in embodiments where the TIM 130 is a eutectic mixture of constituent components, the TIM 130 can be more likely to melt entirely within the first region 137 during normal operation as compared to a non-eutectic embodiment. In FIG. 3, the volume of TIM that undergoes melting is indicated generally by reference numeral 135 and is substantially coextensive with the region 137 overlying the die 112. In other embodiments, e.g., where the TIM 130 is a non-eutectic mixture of constituent components, one or more constituent components in the TIM 130 can melt while one or more other constituent components remains in a solid phase. In some non-eutectic embodiments, however, the TIM 130 can wholly melt within the first region 137 under selected operating conditions.

A second region 136 of material, positioned outward of the first region 137, partially or entirely encloses the first region and typically remains in a solid phase (sometimes referred to as a "solidus phase"). With some non-eutectic mixtures, one or more constituent components of the TIM in the second region 136 can melt while leaving one or more other constituent components in a solid phase. That is to say, the non-eutectic mixture can begin to melt and, according to a temperature of the TIM, its constituent components, and their relative volume, weight or mass percentages, a portion of the non-eutectic mixture can become a liquidus while a portion remains a solidus. For example, the meltable volume (liquidus) 135 can extend past the boundary 116/region 137.

Figure 4:
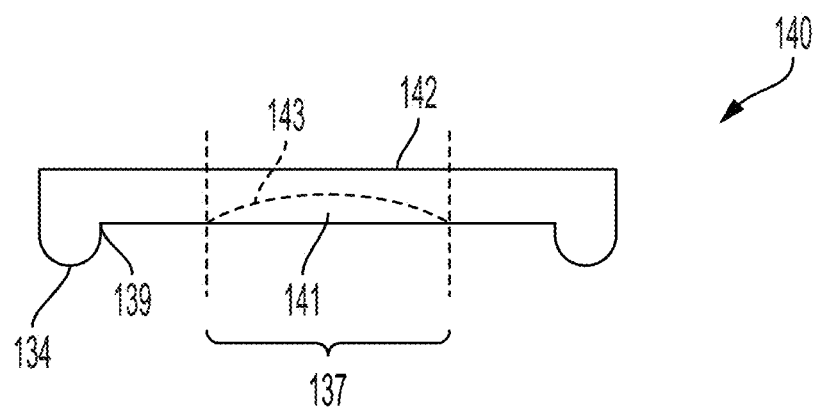
FIG. 4 schematically illustrates an enlarged cross-sectional view of the thermal-interface material in FIGS. 2 and 3 during operation of the heat-generating device.
Figure 5:
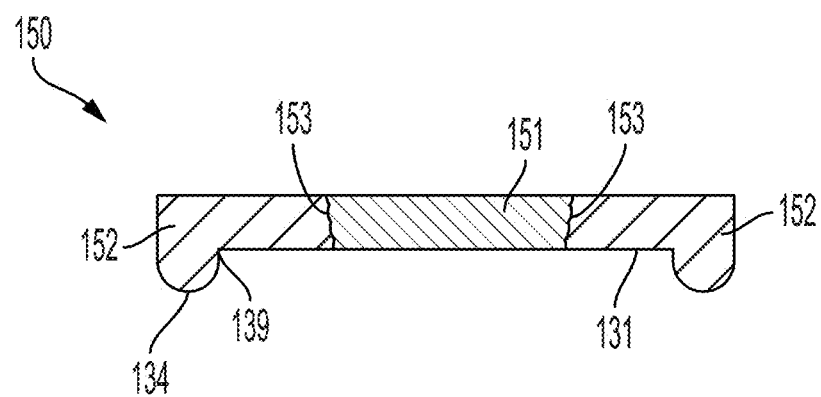
FIG. 5 schematically illustrates another enlarged cross-sectional view of the thermal-interface material in FIGS. 2, 3 and 4 during operation of the heat-generating device.

Such embodiments are illustrated schematically in FIGS. 4 and 5. In FIG. 4, an embodiment of a thermal-interface material 140 is shown. The TIM 140 is substantially the same as the TIM 130 shown in FIG. 3, except in FIG. 4 the TIM 140 is at an elevated operating temperature. In FIG. 4, a portion 141 of the TIM 140 within the region 137 has melted while a corresponding portion 142 of the TIM 130 within the region 137 remains a solidus. A phase-transition boundary 143 between the melted portion 141 and solid portion (or a mixture of a liquidus and solidus) 142 is also shown. Although the portion 141 is shown as being within an outer extent of the region 137 and having a thickness less than a full thickness of the TIM 140, those of ordinary skill in the art will understand and appreciate after considering this disclosure that, depending on the operating temperatures involved and the specific weight-percentages of each constituent component of the TIM 140, the portion 141 can be entirely melted or can be a combination of liquidus and solidus components. Similarly, those of ordinary skill in the art after considering this disclosure will understand that the portion 141 can extend through a full thickness of the TIM 140.

For example, FIG. 5 shows a heated TIM 150 that is similar to the TIM 130, 140 under a different operating condition (e.g., at a higher temperature or embodied as a TIM having a lower liquidus temperature). In FIG. 5, the melted region 151 extends through a full thickness of the TIM 150 and yet lies within an outer boundary of the IHS (indicated by corners 139). Laterally outward of the melted region 151, the TIM 150 has a solidus (or a mixture of liquidus and solidus) region 152 "encapsulating" the melted region 151. An interface boundary 153 extends between the solidus region 152 and the melted region 151.

By remaining a solidus during operation of the heat-generating component 110 and the heat-transfer component 120, the regions 142, 152 can inhibit leakage or seepage of the liquidus TIM 141, 151 from the interstitial gap between the surfaces 111, 122. Moreover, providing a solid (or a solidus-liquidus mixture) barrier encapsulating the melted volume 141, 151 can inhibit diffusion of oxygen to and throughout the melted TIM, inhibiting oxidation of the TIM and maintaining its thermal and other material characteristics.

In each of FIGS. 3, 4 and 5, at a position laterally outward of the IHS boundary (indicated by corners 139), the thermal-interface material 130, 140, 150 defines a thickened region 134 defining a dam that further inhibits leakage or seepage of liquidus (or a mixture of liquidus/solidus) TIM from the interstitial gap between the surfaces 111, 122 of the IHS and heat-transfer component. The thickened region 134 extends laterally outward from a periphery of the IHS 115 (indicated by the corner 139) to an outer periphery of the TIM 130.

In a multi-chip package, not shown, the region of solidus TIM can define a "lattice" extending around each region of liquidus (or mixture of liquidus/solidus) TIM. For example, each melted or meltable (e.g., softened mixture of liquidus and solidus) region can correspond to a given die in the multi-chip package. In such embodiments, the volume 135 of TIM that melts can again be coextensive with each region 137. In other embodiments, e.g., single-chip packages where the die defines one or more "hot-spots" or multi-chip packages where one or more of the plurality of dice defines one or more "hot-spots," each volume 135 that melts can correspond to a given "hot-spot" location and shape, e.g., can be smaller than the region 137 of TIM that overlies a given die. In such embodiments, the second region 136 of the TIM that remains solidus (or a liquidus and solidus mixture) can extend around each meltable region 135 over-top a portion of each respective die. In still other embodiments, the meltable region 135 extends outward of a portion or all of the die 112, with the second region 136 wholly or partially enclosing the meltable region 135. In each of these alternative embodiments, the solidus portion of the TIM can inhibit seepage or leakage of the melted TIM while also inhibiting diffusion of oxygen into and through the melted (liquidus) TIM, inhibiting oxidation of the melted TIM and a corresponding degradation in thermal performance. Where the second region (or a portion thereof) has a mixture of liquidus and solidus, the viscosity of the solidus-liquidus mixture can exceed that of the liquidus in the region 135 and thus can inhibit seepage or leakage of the melted TIM while also inhibiting diffusion of oxygen into and through the melted (liquidus) TIM, inhibiting oxidation of the melted TIM and a corresponding degradation in thermal performance.

III. Heat-Transfer Components with Pre-Applied Tim

In some respects, disclosed principles pertain to heat-transfer components having layer of TIM applied to a heat-transfer surface before assembly of the heat-transfer component with a heat-generating (or a heat-absorbing) device.

Figure 6:
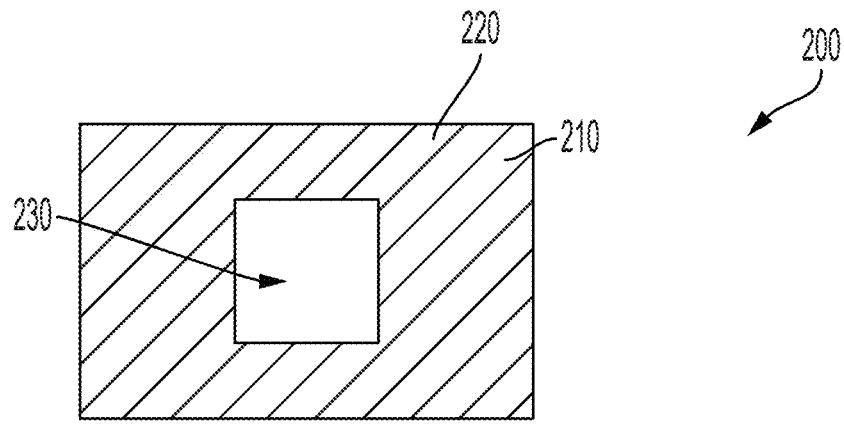
FIG. 6 schematically illustrates an intermediate construct arising from a process for applying a metallic thermal-interface material to a surface of a heat-transfer component.
Figure 7:
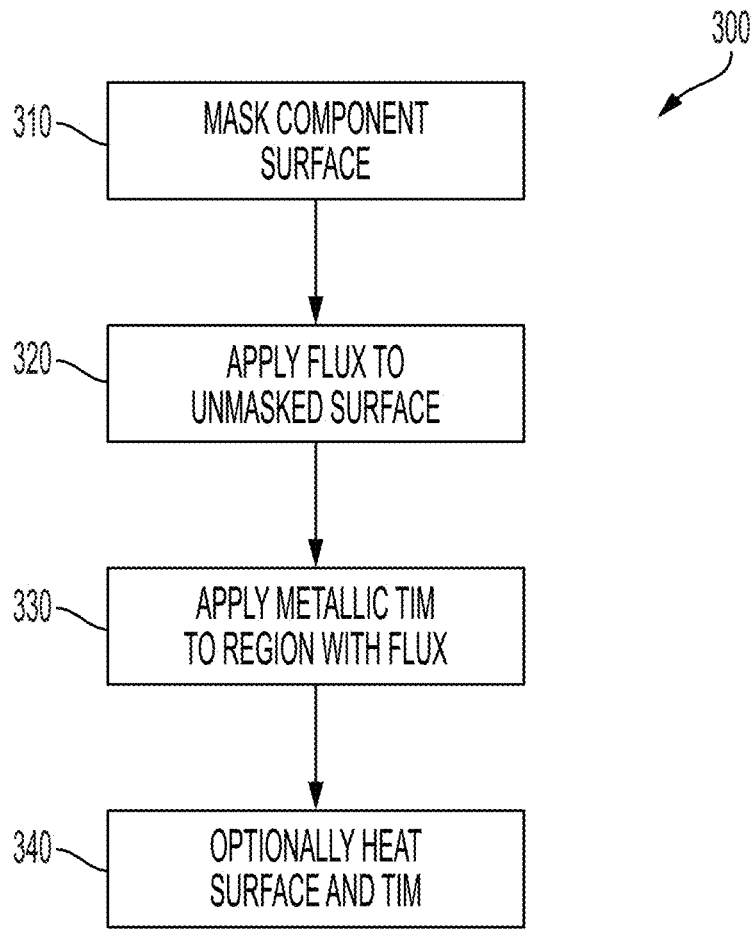
FIG. 7 schematically illustrates a process for applying a metallic thermal-interface material to a surface of a heat-transfer component.

Referring now to FIGS. 6 and 7, a process 300 for applying a thermal-interface material (e.g., any of TIM 130, 140, 150) to a heat-transfer component is described. More particularly, the process 300 solder-bonds the thermal-interface material to the heat-transfer component, providing an enhanced thermal coupling, as well as an enhanced physical coupling, between the heat-transfer component and the TIM compared to prior art heat-transfer components with pre-applied thermal-interface materials (e.g., greases and pastes).

At 310, the process 300 includes the act of masking a component surface. Taking the heat-transfer component 120 (FIG. 2) as an example, a region of the surface 122 can be covered with a mask 220 (420 in FIG. 12) while leaving a region intended to be exposed to a metallic thermal-interface material exposed. Referring again to FIG. 6, a mask 220 is shown applied to a thermal-contact surface of a heat-transfer component, leaving an interior region 230 exposed. The interior region 230 can define an outer periphery (shown as the solid line between the unmarked region 230 and the cross-hatching of the masked region 220) that is larger than an outer periphery of a corresponding IHS surface (e.g., larger than an outer periphery of the IHS 115 in FIG. 2). In FIG. 6, the mask 220 extends to the outer periphery 210 of the heat-transfer component 200.

At 320 in FIG. 7, flux is applied to the unmasked region 230 (FIG. 6). Before applying flux, the unmasked region can be (but need not be) treated to remove an oxidation layer that may have formed on the surface of the heat-transfer component. For example, the region can be sanded with a high-grit sandpaper or otherwise abraded to remove oxidation. Alternatively (or additionally), an oxidation layer can be removed with a chemical etching compound or other known approach for removing oxidation. The mask 220 can prevent such treatments from expanding past the outer periphery of the region 230, as well as prevent or inhibit application of flux beyond the outer periphery of the region 230. Further, some embodiments of heat-transfer components 120 have a base 121 formed of copper. Although some disclosed thermal-interface materials can be soldered to copper, some copper bases 121 are coated with nickel (e.g., electroplated with nickel) or coated with another metal that is more amenable to soldering with a disclosed thermal-interface material than copper. As will be understood by a person having ordinary skill in the art, the act of coating the base 121 with nickel or other material typically can (but need not) occur prior to the act of masking, the act of applying flux to the unmasked region, or both.

At 330, the metallic TIM (400 in FIGS. 13 and 600 in FIG. 10) is applied to the region 230 that has had flux applied. For example, a foil of the metallic TIM can be positioned to overlie the region 230. Alternatively, a molten phase of the metallic TIM can be poured into the region 230. Under either approach, the heat-transfer component can be maintained at an ambient temperature or can be heated (as at 340) to a temperature at or above a melting temperature of the TIM. Pouring a molten phase of the metallic TIM or heating the heat-transfer component beyond the melting temperature of the TIM can form a solder bond between the surface of the heat-transfer component and the TIM. For example, the liquid-phase of the TIM can flow into microscopic interstices on the surface of the heat-transfer component and, in some embodiments, penetrate slightly into the surface of the heat-transfer component. Such wetting and penetration by the TIM can be enhanced by removal of any oxide layer and application of flux as at 320. In some embodiments, the act 320 of applying flux to the unmasked surface, the act 330 of applying the metallic TIM to the fluxed region, or both acts, can include providing an inert atmosphere (e.g., a nitrogen atmosphere) around the surfaces being treated and the TIM being applied to inhibit or eliminate oxidation of the base, oxidation of the TIM, or both, as such oxidation can reduce thermal performance.

Figure 10:
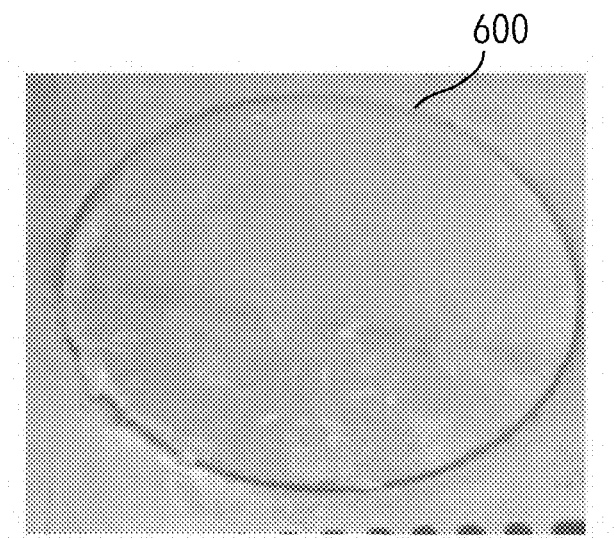
FIG. 10 is a photograph of a surface region of another working embodiment of a heat-transfer component having a metallic thermal-interface material bonded thereto.
Figure 12:
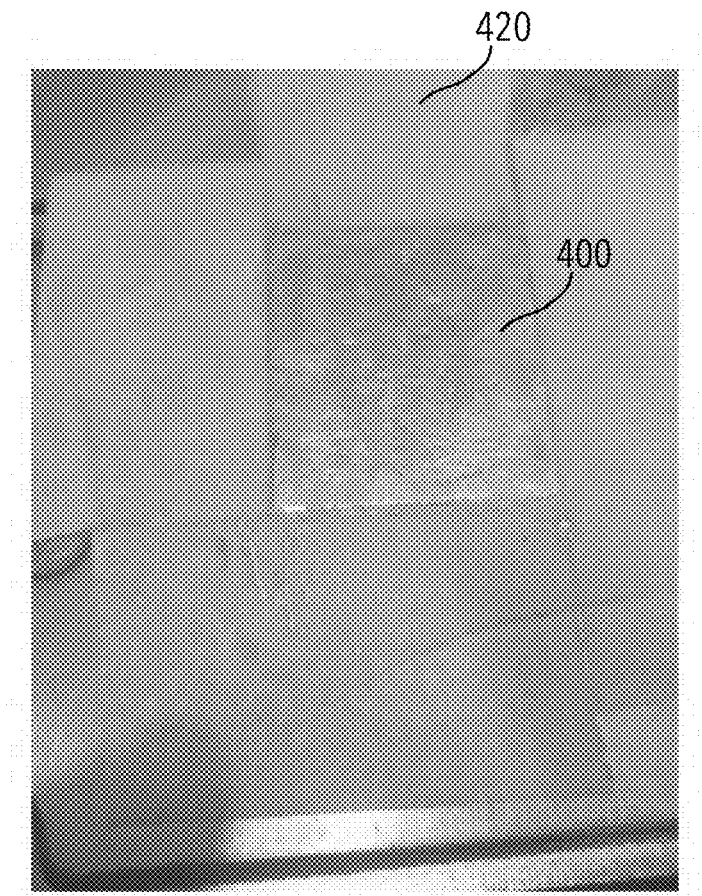
FIG. 12 is a photograph of a working embodiment of an intermediate construct as depicted in FIG. 6.
Figure 13:
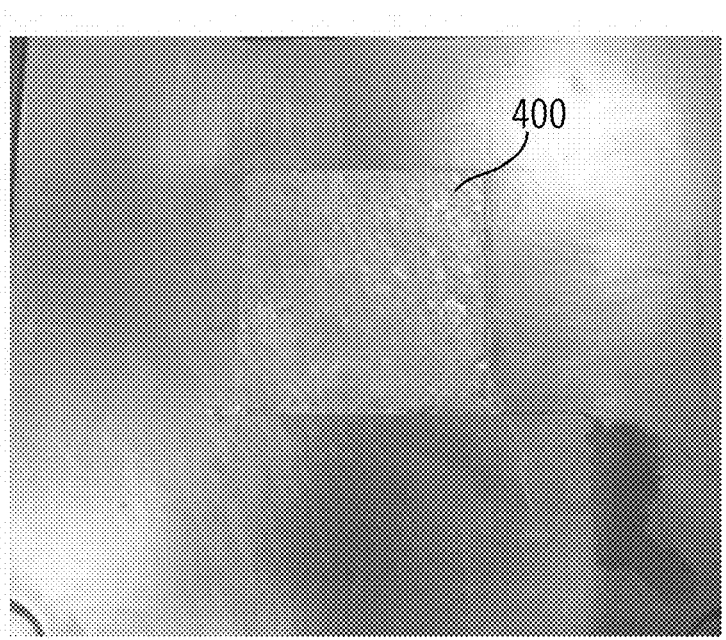
FIG. 13 is a photograph of a working embodiment of a heat-transfer component having soldered thereto a metallic thermal-interface material as described herein.

On cooling, a portion of the TIM forms an intermetallic bond with the heat-transfer component (see FIG. 15), enhancing the durability of the layer of TIM as well as the thermal coupling of the TIM with the heat-transfer component compared to prior heat-transfer components having a pre-applied layer of grease or paste. FIG. 12 is a photograph of a working embodiment of an intermediate construct analogous to the construct 200 shown in FIG. 6. In FIG. 12, the mask remains. FIG. 13 shows the same working embodiment as in FIG. 12, albeit with the mask removed. FIG. 10 shows another working embodiment of a metallic thermal-interface material 600 solder-bonded to a heat-transfer component (e.g., an air-cooled heat sink).

A heat-transfer component with a solder-bonded layer of metallic thermal-interface material can be assembled with a heat-generating (or heat-absorbing) device in an arrangement as in FIG. 2. In some embodiments, an exposed surface (431 in FIGS. 6 and 631 in FIG. 11) of the TIM can be prepared to mate closely to a contour of an intended surface of a heat-generating component, e.g., prior to physically assembling the heat-transfer component with the heat-generating component. For example, after or in conjunction with the act 330 of applying a metallic TIM to the fluxed region of the heat-transfer component, a flat (or other suitably contoured) tool having a contour mimicking a contour of an intended IHS surface 111 can be urged against the TIM (e.g., the molten TIM). If applied to a molten TIM, the tool can remain in contact with the TIM until the TIM solidifies. Such contouring of the TIM can enhance mating of the TIM with the IHS while also reducing or eliminating excess TIM that otherwise could escape the bond-line between the surface 122 of the heat-transfer component and the upper surface 111 of the IHS. In some embodiments, the tool can be a sheet of glass or ceramic having at least one major surface having the desired contour (e.g., flat or mimicking a contour of the intended IHS).

After this physically assembling the heat-transfer component with the heat-generating component, and before normal system operation, the interstitial layer of thermal-interface material and the bounding, opposed surfaces of the heat-generating (or heat-absorbing) device and heat-transfer component can be heated beyond a melting temperature of the thermal-interface material. For example, the assembly can be heated in an oven or a heat-generating device can be operated under a load sufficient to heat the TIM beyond its melting temperature.

Figure 8:
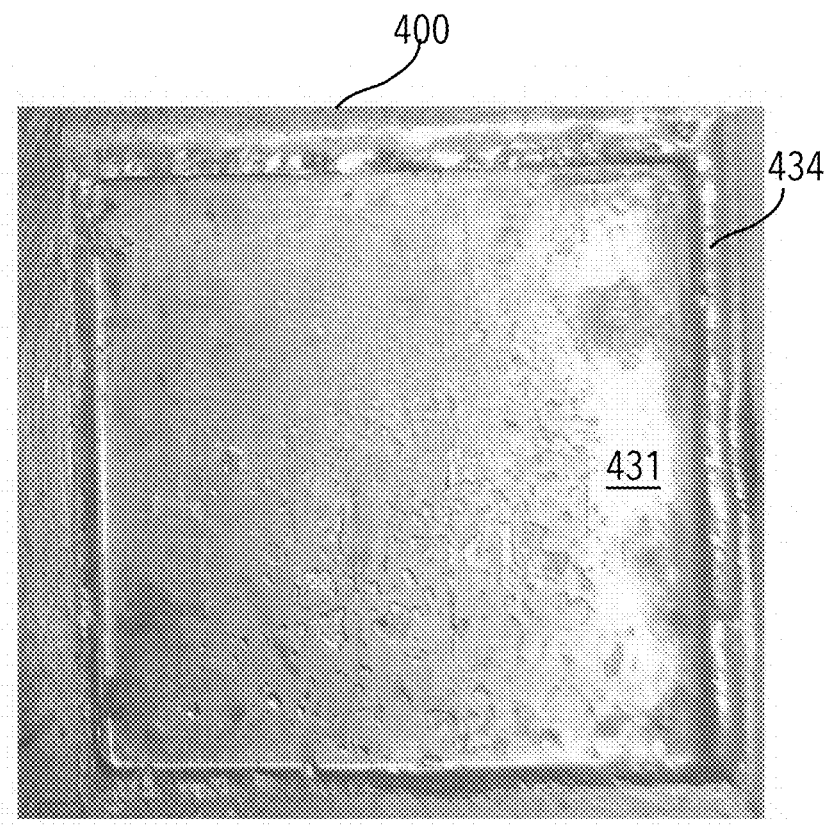
FIG. 8 is a photograph of a surface region of a working embodiment of a heat-transfer component having a metallic thermal-interface material bonded thereto.
Figure 9:
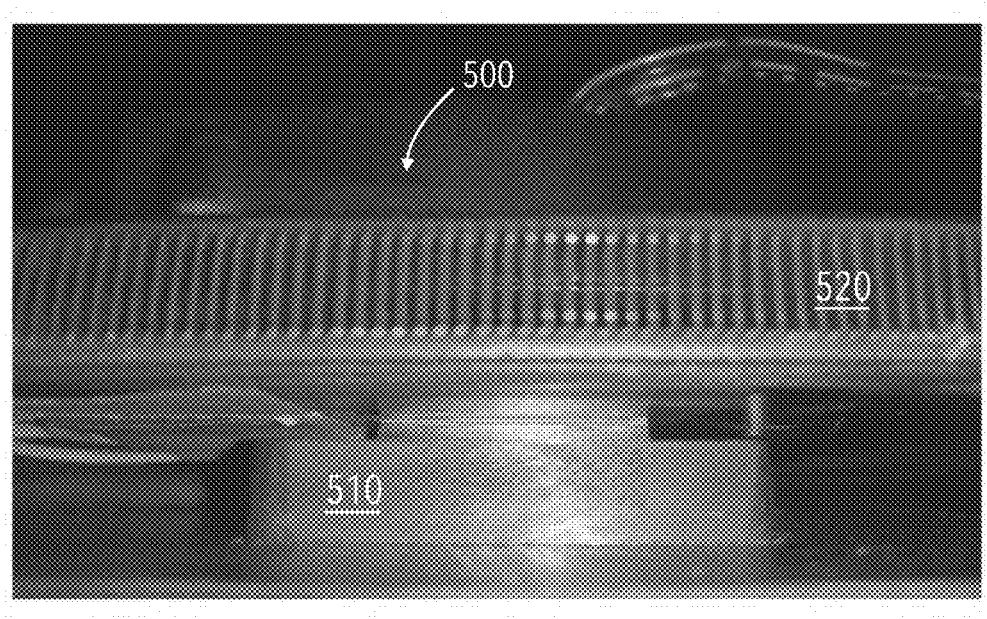
FIG. 9 is a photograph showing a side-elevation of a heat-transfer component mounted to a heat-generating device and an interface therebetween filled with a metallic thermal-interface material as described herein.
Figure 11:
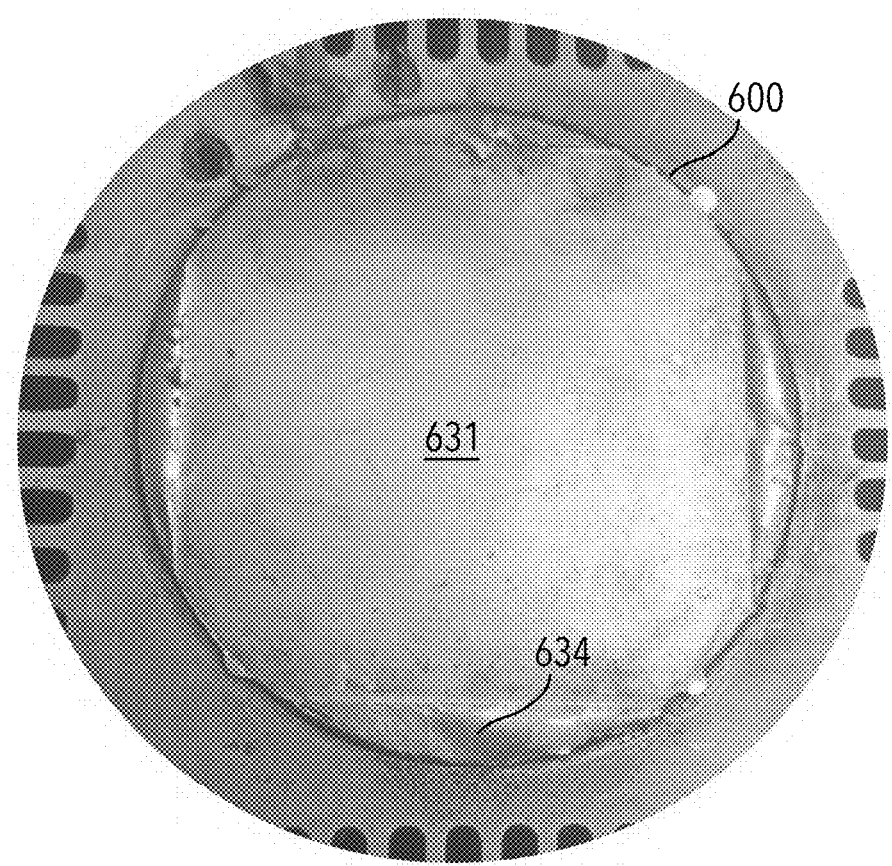
FIG. 11 is a photograph of a surface region of yet another working embodiment of a heat-transfer component having a metallic thermal-interface material bonded thereto.

This further cycle of heating can enhance thermal contact between the TIM and the heat-generating (or heat-absorbing) device, thus improving overall thermal contact between the heat-transfer component and the heat-generating (or heat-absorbing) device. For example, this further cycle of heating can allow excess TIM to fill any interstitial air gaps. Such further cycle of heating also can reduce a thickness of the interstitial space between the opposed surfaces of the heat-generating (or heat-absorbing) device and the heat-transfer component, as by allowing excess TIM to flow outwardly past a heat-transfer surface 431 of the heat-generating (or heat-absorbing) device, forming a ridge (or dam, analogous to the dam 134 shown in FIG. 2, dam 434 shown in FIG. 8, dam 634 shown in FIG. 11). FIGS. 8 and 11 show the working embodiments 400, 600 in FIGS. 13 and 10, respectively, after undergoing a further cycle of heating and being disassembled from the test rig 500 shown in FIG. 9 (heat sink 520 and heat source 510).

IV. Metallic Thermal Interface Material Compositions and Properties

Disclosed metallic thermal-interface materials can incorporate eutectic and non-eutectic mixtures of Bismuth, Indium, Tin and Gallium. As understood by those of ordinary skill in the art, eutectic mixtures exhibit a melting-point temperature (or a narrow-band of temperatures over which melting occurs) that is below the melting point of each constituent component in the mixture, while non-eutectic mixtures melt over a broader range of temperatures. Adjusting the relative weight percent of each constituent component in a mixture of Bismuth, Indium, Tin and Gallium can correspondingly adjust the melting temperature (or range of temperatures for non-eutectic mixtures) of the mixture.

Some metallic TIM embodiments suitable for forming a solder-bond with a heat-transfer component as described herein have a eutectic melting point temperature of about 60° C. (e.g., between about 57° C. and about 63° C., such as, for example, between about 58° C. and about 61° C.), a eutectic melting point temperature of about 70° C. (e.g., between about 67° C. and about 73° C., such as, for example, between about 68° C. and about 71° C.), a eutectic melting point temperature of about 80° C. (e.g., between about 77° C. and about 83° C., such as, for example, between about 78° C. and about 81° C.), and a eutectic melting point temperature of about 90° C. (e.g., between about 87° C. and about 93° C., such as, for example, between about 88° C. and about 91° C.).

Some metallic TIM embodiments suitable for forming a solder-bond with a heat-transfer component as described herein are non-eutectic. Such non-eutectic TIMs exhibit a hysteresis-like range of phase-change temperatures. For example, some disclosed, non-eutectic metallic TIMs have a melting point temperature (e.g., where a negligible portion of solidus remains) of about 90° C. and a freezing point temperature (e.g., where a negligible portion of liquidus remains) of about 70° C. As noted above, some components of such a non-eutectic TIM begin to melt below about 90° C. (e.g., between about 75° C. and about 85° C., such as, for example about 85° C.). Similarly, some components of such a non-eutectic TIM begin to solidify above about 70° C. (e.g., between about 75° C. and about 85° C., such as, for example about 85° C.).

In some disclosed alloys, a viscosity of a molten phase is very low and reduces a bond-line thickness between the base surface 122 and the upper surface 111 of the IHS by such a large degree that a thermal resistance between the base surface 122 and the upper surface 111 deteriorates compared to other disclosed alloys. Nevertheless, such alloys can be combined with one or more other materials that remain in a solid phase during operation of the heat-generating component, e.g., a powdered or other small-particle form of the other material, to increase a viscosity or to provide a lower-threshold bond-line thickness between the base surface 122 and the upper surface 111. Examples of such other materials include particle forms of ceramics, e.g., aluminum oxide, aluminum nitride, silicon carbide, diamond, zinc oxide, boron nitride, etc. Other examples of such other materials include particle forms of other metal alloys, e.g., alloys of copper or silver.

V. Other Embodiments

The embodiments described above generally concern metallic thermal-interface materials, some of which partially or wholly undergo phase transition within an expected range of operating temperatures. More particularly, but not exclusively, this disclosure pertains to devices and systems for transferring heat, e.g., for cooling heat-generating, electrical components, that incorporate such metallic thermal-interface materials.

Despite the description of certain details of metallic thermal-interface materials, as well as heat-transfer components and electrical devices that incorporate them, the previous description is provided to enable a person skilled in the art to make or use the disclosed principles. Embodiments other than those described above in detail are contemplated based on the principles disclosed herein, together with any attendant changes in configurations of the respective apparatus or changes in order of method acts described herein, without departing from the spirit or scope of this disclosure. Various modifications to the examples described herein will be readily apparent to those skilled in the art.

For example, heat-generating devices may be embodied other than as shown in FIG. 2. For example, a single package of an electrical device can have one or more "chiplets" rather than the single die 112 shown in FIG. 2. In such an embodiment, one or more of the chiplets may be packaged under an integrated heat spreader (IHS) and the IHS can be placed into thermal contact with a corresponding heat-transfer component. Still further, one or more of the chiplets may have a bare die placed into thermal contact with a heat-transfer component. In some embodiments, each heat-generating die or other component is placed under an IHS, which is placed into thermal contact with the heat-transfer component. In some embodiments, each heat-generating device has a bare die, which is placed into thermal contact with the heat-transfer component. In still other system embodiments, one or more of the heat-generating die or other components is placed under an IHS, which is placed into thermal contact with the heat-transfer component, and one or more other of the heat-generating device has a bare die, which is placed into thermal contact with the heat-transfer component.

Further alternative embodiments are possible. For example, the description above provides details of a thermal-interface material soldered to a heat-transfer component prior to assembly of the heat-transfer component with a heat-generating component. In other embodiments, the thermal-interface material can be soldered to an outer surface (e.g., surface 117 in FIG. 2) of an IHS (e.g., rather than to the base 122 of the heat-transfer component 120) prior to assembly of the heat-transfer component with the heat-generating component. In still other alternative embodiments, the primary thermal-interface material 118 can be soldered to an underside of the IHS prior to assembly of the IHS with the die 112 to achieve a similar manner of reduction or elimination of a thermal-contact resistance between the IHS and the 115 and the primary thermal-interface material 118 as is reduced or eliminated between the base 122 of the heat-transfer component 120 and the upper surface 111 by soldering the thermal-interface material 130 to the base 122.

Further, other system configurations and types incorporating metallic thermal-interface materials of the type described herein can be cooled or heated. For example, one or more electrical components in a 1U (or even a ½-U) server (or other electronic device, such as, for example, a 5G cellular radio, a power generation or transmission device) can be cooled by a heat-transfer device and a disclosed thermal-interface material can be applied within an interstitial gap between the heat-transfer device and the electrical component. Many other types of electrical devices, such as, for example, a graphics processor, a television, power electronics devices, communications transmission devices and other networking devices, among others, have heat-dissipating devices that can incorporate metallic thermal-interface materials as described. As but one particular example, one or more heat-dissipating components in a communications or other network device (e.g., a so-called 5 G transmission device) can be cooled by a heat-transfer device incorporating a pre-applied metallic TIM. Similarly, some electrical storage batteries dissipate substantial amounts of heat while discharging or charging. For example, some batteries that can store substantial amounts of energy, e.g., a 5 kW-h to 50 kW-h battery, can be cooled by a system that incorporates a metallic thermal-interface material as described.

Directions and other relative references (e.g., up, down, top, bottom, left, right, rearward, forward, etc.) may be used to facilitate discussion of the drawings and principles herein, but are not intended to be limiting. For example, certain terms may be used such as "up," "down,", "upper," "lower," "horizontal," "vertical," "left," "right," and the like. Such terms are used, where applicable, to provide some clarity of description when dealing with relative relationships, particularly with respect to the illustrated embodiments. Such terms are not, however, intended to imply absolute relationships, positions, and/or orientations. For example, with respect to an object, an "upper" surface can become a "lower" surface simply by turning the object over. Nevertheless, it is still the same surface, and the object remains the same. As used herein, "and/or" means "and" or "or", as well as "and" and "or." Moreover, all patent and non-patent literature cited herein is hereby incorporated by reference in its entirety for all purposes.

And, those of ordinary skill in the art will appreciate that the exemplary embodiments disclosed herein can be adapted to various configurations and/or uses without departing from the disclosed principles. Applying the principles disclosed herein, it is possible to provide a wide variety of metallic thermal-interface materials and heat-transfer components incorporating such metallic thermal-interface materials, as well as related methods and systems. For example, the principles described above in connection with any particular example can be combined with the principles described in connection with another example described herein. Thus, all structural and functional equivalents to the features and method acts of the various embodiments described throughout the disclosure that are known or later come to be known to those of ordinary skill in the art are intended to be encompassed by the principles described and the features and acts claimed herein. Accordingly, neither the claims nor this detailed description shall be construed in a limiting sense, and following a review of this disclosure, those of ordinary skill in the art will appreciate the wide variety of components, devices, systems, and related methods that can be devised using the various concepts described herein.

Moreover, nothing disclosed herein is intended to be dedicated to the public regardless of whether such disclosure is explicitly recited in the claims. No claim feature is to be construed under the provisions of 35 USC 112(f), unless the feature is expressly recited using the phrase "means for" or "step for".

The appended claims are not intended to be limited to the embodiments shown herein, but are to be accorded the full scope consistent with the language of the claims, wherein reference to a feature in the singular, such as by use of the article "a" or "an" is not intended to mean "one and only one" unless specifically so stated, but rather "one or more". Further, in view of the many possible embodiments to which the disclosed principles can be applied, we reserve the right to claim any and all combinations of features and technologies described herein as understood by a person of ordinary skill in the art, including the right to claim, for example, all that comes within the scope and spirit of the foregoing description, as well as the combinations recited, literally and equivalently, in any claims presented anytime throughout prosecution of this application or any application claiming benefit of or priority from this application, and more particularly but not exclusively in the claims appended hereto.

I currently claim:

1. An integrated heat-spreader configured to overlie an integrated-circuit die, the integrated heat-spreader comprising:
    a first major surface defining a thermal-interface surface and being configured to face a heat-removal device;
    a second major surface positioned opposite the thermal-interface surface and being configured to face the integrated-circuit die; and
    a metallic thermal-interface material bonded to the thermal-interface surface, the metallic thermal-interface material having a solid-to-liquid transition temperature between about 60° C. and about 90° C, wherein the metallic thermal-interface material is a eutectic mixture of Bismuth, Indium, Tin and Gallium.

2. The integrated heat-spreader according to claim 1, wherein the solid-to-liquid transition temperature is about 60° C., about 70° C., about 80° C., or about 90° C.

3. An integrated heat-spreader configured to overlie an integrated-circuit die, the integrated heat-spreader comprising:
    a first major surface defining a thermal-interface surface and being configured to face a heat-removal device;
    a second major surface positioned opposite the thermal-interface surface and being configured to face the integrated-circuit die; and
    a metallic thermal-interface material bonded to the thermal-interface surface, the metallic thermal-interface material having a solid-to-liquid transition temperature between about 60° C. and about 90° C., wherein the metallic thermal-interface material is a non-eutectic mixture of Bismuth, Indium, Tin and Gallium.

4. The integrated heat-spreader according to claim 3, wherein the solid-to-liquid transition temperature is about 90° C.

5. The integrated heat-spreader according to claim 4, wherein the metallic thermal-interface material has a liquid-to-solid transition temperature of about 70° C.

6. The integrated heat-spreader according to claim 3, wherein the solid-to-liquid transition temperature is less than about 90° C. and the liquid-to-solid transition temperature is above about 70° C.

7. A heat-removal device configured to dissipate heat received from a heat-generating electronic component, the heat-removal device comprising:
    a base defining a first major surface and a second major surface opposite the first major surface;
    a metallic thermal-interface material bonded to the first major surface, the metallic thermal-interface material having a solid-to-liquid transition temperature between about 60° C. and about 90° C., wherein the metallic thermal-interface material is a eutectic mixture of Bismuth, Indium, Tin and Gallium; and
    a plurality of fins extending from the second major surface.

8. The heat-removal device according to claim 7, wherein the solid-to-liquid transition temperature is about 60° C., about 70° C., about 80° C., or about 90° C.

9. An electrical device, comprising:
    a heat-generating component defining a first thermal-interface surface;
    an integrated heat spreader configured to overlie the heat-generating component, the integrated heat spreader defining a first major surface and a second major surface positioned opposite the first major surface, the first major surface being configured to face a heat-removal device and the second major surface being configured to face the heat-generating component; and
    a metallic thermal-interface material bonded to the second major surface of the integrated heat spreader, the metallic thermal-interface material having a solid-to-liquid transition temperature between about 60° C. and about 90° C.; wherein the metallic thermal-interface material is a eutectic mixture of Bismuth, Indium, Tin and Gallium.

10. The electrical device according to claim 9, wherein the solid-to-liquid transition temperature is about 60° C., about 70° C., about 80° C., or about 90° C.

11. The electrical device according to claim 9, wherein the heat-generating component is an electronic processing unit.

12. The electrical device according to claim 9, wherein the heat-generating component is an electrical storage battery.

13. An electrical device, comprising:
    a heat-generating component defining a first thermal-interface surface;
    a heat-removal device configured to dissipate heat received from the heat-generating electronic component, the heat-removal device having a base defining a first major surface and further defining a second major surface opposite the first major surface, wherein a plurality of fins extends from the second major surface of the heat-removal device, and wherein a metallic thermal-interface material is bonded to the first major surface of the base, the metallic thermal-interface material having a solid-to-liquid transition temperature between about 60° C. and about 90° C.; wherein the metallic thermal-interface material is a eutectic mixture of Bismuth, Indium, Tin and Gallium.

14. The electrical device according to claim 13, wherein the solid-to-liquid transition temperature is about 60° C., about 70° C., about 80° C., or about 90° C.

15. The electrical device according to claim 13, wherein the heat-generating component is an electronic processing unit.

16. The electrical device according to claim 13, wherein the heat-generating component is an electrical storage battery.

17. A heat-removal device configured to dissipate heat received from a heat-generating electronic component, the heat-removal device comprising:
- a base defining a first major surface and a second major surface opposite the first major surface;
- a metallic thermal-interface material bonded to the first major surface, the metallic thermal-interface material having a solid-to-liquid transition temperature between about 60° C. and about 90° C., wherein the metallic thermal-interface material is a non-eutectic mixture of Bismuth, Indium, Tin and Gallium; and
- a plurality of fins extending from the second major surface.

18. The heat-removal device according to claim 17, wherein the solid-to-liquid transition temperature is about 90° C.

19. The heat-removal device according to claim 18, wherein the metallic thermal-interface material has a liquid-to-solid transition temperature of about 70° C.

20. The heat-removal device according to claim 17, wherein the solid-to-liquid transition temperature is less than about 90° C. and the liquid-to-solid transition temperature is above about 70° C.

21. An electrical device, comprising:
- a heat-generating component defining a first thermal-interface surface;
- an integrated heat spreader configured to overlie the heat-generating component, the integrated heat spreader defining a first major surface and a second major surface positioned opposite the first major surface, the first major surface being configured to face a heat-removal device and the second major surface being configured to face the heat-generating component; and
- a metallic thermal-interface material bonded to the second major surface of the integrated heat spreader, the metallic thermal-interface material having a solid-to-liquid transition temperature between about 60° C. and about 90° C.; wherein the metallic thermal-interface material is a non-eutectic mixture of Bismuth, Indium, Tin and Gallium.

22. The electrical device according to claim 21, wherein the heat-generating component is an electronic processing unit.

23. The electrical device according to claim 21, wherein the heat-generating component is an electrical storage battery.

24. The electrical device according to claim 21, wherein the solid-to-liquid transition temperature is about 90° C.

25. The electrical device according to claim 24, wherein the metallic thermal-interface material has a liquid-to-solid transition temperature of about 70° C.

26. The electrical device according to claim 21, wherein the solidus-to-liquidus transition temperature is less than about 90° C. and the liquidus-to-solidus transition temperature is above about 70° C.

27. An electrical device, comprising:
- a heat-generating component defining a first thermal-interface surface;
- a heat-removal device configured to dissipate heat received from the heat-generating electronic component, the heat-removal device having a base defining a first major surface and further defining a second major surface opposite the first major surface, wherein a plurality of fins extends from the second major surface of the heat-removal device, and wherein a metallic thermal-interface material is bonded to the first major surface of the base, the metallic thermal-interface material having a solid-to-liquid transition temperature between about 60° C. and about 90° C.; wherein the metallic thermal-interface material is a non-eutectic mixture of Bismuth, Indium, Tin and Gallium.

28. The electrical device according to claim 27, wherein the heat-generating component is an electronic processing unit.

29. The electrical device according to claim 27, wherein the heat-generating component is an electrical storage battery.

30. The electrical device according to claim 27, wherein the solid-to-liquid transition temperature is about 90° C.

31. The electrical device according to claim 30, wherein the metallic thermal-interface material has a liquid-to-solid transition temperature of about 70° C.

32. The electrical device according to claim 27, where solid-to-liquid transition temperature is less than about 90° C. and the liquid-to-solid transition temperature is above about 70° C.

* * * * *